(12) United States Patent
Radke et al.

(10) Patent No.: US 10,891,188 B2
(45) Date of Patent: Jan. 12, 2021

(54) MEMORY DEVICES HAVING DIFFERENTLY CONFIGURED BLOCKS OF MEMORY CELLS

(71) Applicant: MICRON TECHNOLOGY, INC., Boise, ID (US)

(72) Inventors: William H. Radke, Los Gatos, CA (US); Tommaso Vali, Sezze (IT); Michele Incarnati, Gioia Dei Marsi AG (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/516,611

(22) Filed: Jul. 19, 2019

(65) Prior Publication Data

US 2019/0340066 A1    Nov. 7, 2019

Related U.S. Application Data

(60) Continuation of application No. 15/414,669, filed on Jan. 25, 2017, now Pat. No. 10,409,673, which is a division of application No. 14/513,880, filed on Oct. 14, 2014, now Pat. No. 9,594,676, which is a division of application No. 13/208,802, filed on Aug. 12, 2011, now Pat. No. 8,902,653.

(51) Int. Cl.
*G11C 29/00*  (2006.01)
*G06F 11/10*  (2006.01)
(Continued)

(52) U.S. Cl.
CPC .......... *G06F 11/1048* (2013.01); *G06F 3/064* (2013.01); *G06F 3/0604* (2013.01);
(Continued)

(58) Field of Classification Search
CPC ..... G11C 11/5628; G11C 29/52; G11C 16/10; G11C 16/0483; G06F 11/1048;
(Continued)

(56) References Cited

U.S. PATENT DOCUMENTS 5,986,933 A   11/1999   Takeuchi et al.
6,961,890 B2  11/2005   Smith
(Continued)

FOREIGN PATENT DOCUMENTS

JP    10-177797    6/1998
JP    2003-131954  5/2003
JP    2009-282923  12/2009

OTHER PUBLICATIONS

Chinese Office Action for CN Application No. 201280044579.0 dated Sep. 2, 2015 (6 Pages). The US counterpart of CN101079322A is 2007/234183. The US counterpart of CN1754230A is 2004/145952.

(Continued)

*Primary Examiner* — Guerrier Merant
(74) *Attorney, Agent, or Firm* — Dicke, Billig & Czaja, PLLC

(57) ABSTRACT

A memory device has a plurality of individually erasable blocks of memory cells and a controller configured to configure a first block of memory cells of the plurality of blocks of memory cells in a first configuration comprising one or more groups of overhead data memory cells, to configure a second block of memory cells of the plurality of blocks of memory cells in a second configuration comprising a group of user data memory cells and a group of overhead data memory cells, and to configure a third block of memory cells of the plurality of blocks of memory cells in a third configuration comprising only a group of user data memory cells. The group of overhead data memory cells of the second block of memory cells has a different storage capacity than at least one group of overhead data memory cells of the one or more groups of overhead data memory cells of the first block of memory cells.

20 Claims, 10 Drawing Sheets

(51) Int. Cl.
*G11C 11/56* (2006.01)
*G11C 16/04* (2006.01)
*G11C 16/10* (2006.01)
*G06F 3/06* (2006.01)
*G06F 12/02* (2006.01)
*G06F 12/06* (2006.01)
*G11C 29/52* (2006.01)

(52) U.S. Cl.
CPC .......... *G06F 3/0608* (2013.01); *G06F 3/0629* (2013.01); *G06F 3/0631* (2013.01); *G06F 3/0679* (2013.01); *G06F 11/1068* (2013.01); *G06F 11/1072* (2013.01); *G06F 12/0207* (2013.01); *G06F 12/0646* (2013.01); *G11C 11/5628* (2013.01); *G11C 16/0483* (2013.01); *G11C 16/10* (2013.01); *G11C 29/52* (2013.01)

(58) Field of Classification Search
CPC .... G06F 3/0608; G06F 3/0631; G06F 3/0679; G06F 11/1068; G06F 12/0207; G06F 12/0646; G06F 3/064; G06F 3/0629; G06F 3/0604; G06F 11/1072; G06F 3/0616; G06F 3/0658; G06F 3/0688; G06F 11/108; G06F 11/1008; G06F 12/0246; G06F 2212/7208
See application file for complete search history.

(56) References Cited

U.S. PATENT DOCUMENTS

| | | | |
|---|---|---|---|
| 7,155,559 B1 | 12/2006 | Estakhri et al. | |
| 7,350,044 B2 | 3/2008 | Keays | |
| 7,546,515 B2 | 6/2009 | Gross et al. | |
| 7,702,954 B2 | 4/2010 | Yoshida | |
| 7,870,457 B2 | 1/2011 | Mokhlesi | |
| 8,064,258 B2 | 11/2011 | Han | |
| 8,612,836 B2 | 12/2013 | Yoon et al. | |
| 8,902,653 B2 | 12/2014 | Radke et al. | |
| 9,594,676 B2 * | 3/2017 | Radke | G11C 11/5628 |
| 10,409,673 B2 * | 9/2019 | Radke | G06F 11/1068 |
| 2004/0145952 A1 | 7/2004 | Chen et al. | |
| 2005/0228962 A1 | 10/2005 | Takase et al. | |
| 2005/0268203 A1 | 12/2005 | Keays | |
| 2006/0206770 A1 | 9/2006 | Chen et al. | |
| 2006/0248434 A1 | 11/2006 | Radke et al. | |
| 2007/0220396 A1 | 9/2007 | Jackson | |
| 2007/0234183 A1 | 10/2007 | Hawg et al. | |
| 2008/0016428 A1 | 1/2008 | Lee et al. | |
| 2008/0091971 A1 | 4/2008 | Yoshida | |
| 2008/0098190 A1 | 4/2008 | Takase et al. | |
| 2008/0282106 A1 | 11/2008 | Shalvi et al. | |
| 2009/0150597 A1 | 6/2009 | Yang et al. | |
| 2009/0259799 A1 | 10/2009 | Wong | |
| 2009/0259807 A1 | 10/2009 | Estakhri et al. | |
| 2010/0011276 A1 | 1/2010 | Chen et al. | |
| 2010/0017682 A1 | 1/2010 | Jackson | |
| 2010/0030945 A1 | 2/2010 | Yuan et al. | |
| 2010/0199125 A1 | 8/2010 | Reche | |
| 2010/0251066 A1 | 9/2010 | Radke | |
| 2010/0262755 A1 | 10/2010 | Becker et al. | |
| 2010/0281341 A1 | 11/2010 | Wu et al. | |
| 2012/0030540 A1 | 2/2012 | Bacchin et al. | |
| 2013/0212449 A1 | 8/2013 | O'Connell | |

OTHER PUBLICATIONS

European Search Report for EP Application No. 12823624.7 dated May 13, 2015 (6 pages).

* cited by examiner

MEMORY DEVICES HAVING DIFFERENTLY CONFIGURED BLOCKS OF MEMORY CELLS

RELATED APPLICATION

This application is a continuation of U.S. application Ser. No. 15/414,699, filed Jan. 25, 2017 and issued as U.S. Pat. No. 10,409,673 on Sep. 10, 2019, which is a divisional of U.S. application Ser. No. 14/513,880, filed Oct. 14, 2014 and issued as U.S. Pat. No. 9,594,676 on Mar. 14, 2017, which is a divisional of U.S. application Ser. No. 13/208,802, filed Aug. 12, 2011 and issued as U.S. Pat. No. 8,902,653 on Dec. 2, 2014, which are commonly assigned and incorporated in their entirety herein by reference.

TECHNICAL FIELD

The present disclosure relates generally to semiconductor memories and, in particular, in one or more embodiments, the present disclosure relates to a configuration of memory cells in non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory is typically arranged in a memory array 100 comprising a plurality of blocks of memory cells such as shown in FIG. 1, for example. Each row 102 of FIG. 1 represents a block of memory in a typical memory device. Data is stored in the memory array 100, i.e., an array of memory cells, by performing a programming operation on the memory device. Data can be read from the memory array 100 by performing a read operation.

Recognizing that errors might occur in the reading of data values from the memory device, the memory device might employ one or more types of error correction methods. Error Correction Schemes, commonly referred to as error correction codes (ECC), can be implemented in order to detect and/or attempt to correct these errors. Various ECCs comprise codes in which each data signal subjected to the ECC should conform to the specific rules of construction of the ECC. Departures from this construction of data (i.e., errors) that are not too great can generally be automatically detected and sometimes corrected. Examples of ECCs include Hamming code, BCH code, Reed-Solomon code, Reed-Muller code, Binary Golay code, Low-Density Parity code, and Trellis Code modulation. Some ECCs can correct single-bit errors and detect double-bit errors. Other ECCs can detect and/or correct multi-bit errors, for example.

Typically, a memory device will store user data in a first group of memory cells (which can be viewed as, for example, a first set of memory locations, a user data space, a user data portion and/or a user data storage area) and error correction code (ECC) data in a second group of memory cells of each block. These memory cell groupings are typically determined during design and layout of the memory device and the memory allocation for user data storage and ECC data storage is typically a permanent configuration of the memory device. During a read operation, both the stored user data and the ECC data are read from the memory array in response to a read request of the user data. Using known algorithms, the user data returned from the read operation is compared to the ECC data. If errors are detected and those errors are within the limits of the ECC, e.g., sufficient ECC resolution exists in the stored ECC data, the errors may be corrected.

By way of example, each block 102 of FIG. 1 is configured during design of the memory device based upon a desired ECC scheme to be utilized. Each user data memory area 110 has an associated ECC memory area 112. For example, ECC area $112_1$ stores ECC data associated with user data stored in user data storage area $110_1$, ECC area $112_2$ stores ECC data specific to user data stored in user data storage area $110_2$, etc. Block storage area 114 might store additional data (e.g., metadata) specific to the entire block 102, for example. This fixed configuration is repeated in each block of the memory device 100. Areas such as 112 and 114 are sometimes referred to collectively as overhead space.

However, different ECC codes require different amounts of memory cells to store their respective ECC data. Thus, if it is desired to accommodate more than one ECC code, the ECC data storage area of each block of the memory device is configured (e.g., allocated) to support an ECC code having the largest ECC storage requirements that might be utilized. However, this can be inefficient in situations wherein an ECC code is utilized which does not require the entire amount of allocated ECC data storage areas in the memory device, thus leaving memory cells unused and unavailable. A typical memory device might be allocated with blocks having 2048B (byte) of user data space and 140B of ECC data space to accommodate the largest ECC code(s) that might be desired. For example, ECC data storage areas $112_1$ and $112_2$ together might comprise 140B. This configuration (e.g., arrangement) of each block of memory would be repeated throughout the memory array 100. Thus, the memory array would comprise a number of blocks of memory each having the same user data space and ECC data space configuration per block. If an ECC is utilized which does not require the full 140B of ECC data space allocated for each block of user data cells, the remaining allocated ECC data space ends up not being utilized. Alternatively, if greater reliability is desired, the 140B of ECC data space might not be sufficient to store ECC data at the desired ECC resolution. For example, it may be desirable to have a particular level of reliability and a particular ECC code might be selected to be able to correct a certain number of errors occurring in user data stored in a memory device. If insufficient ECC data space is allocated, there might not be enough ECC data (e.g., insufficient ECC data resolution) to achieve the desired level of reliability and the number of errors that could be corrected might be reduced, for example.

As discussed above, the memory array configuration, such as shown in FIG. 1, is typically fixed and cannot be changed at a later time. However, some applications may require larger or smaller user data storage areas 110 than those originally allocated in the memory device. Thus, user data might not be as efficiently stored and/or retrieved from the memory device, for example. Further as part of the manufacturing process of the memory device, a controller in the memory device (e.g., control circuitry) is typically configured to interact with the memory array adhering to the fixed configuration of the blocks of memory cells, such as those shown in FIG. 1. For example, the memory array configuration data might be programmed into the controller utilizing firmware, for example. Thus, the controller may be permanently configured to operate with the memory array adhering to the memory device configuration programmed into the controller.

For the reasons stated above, and for other reasons stated below which will become apparent to those skilled in the art upon reading and understanding the present disclosure, there is a need in the art for alternate configurations of memory cells in memory devices.

DETAILED DESCRIPTION

Figure 1:
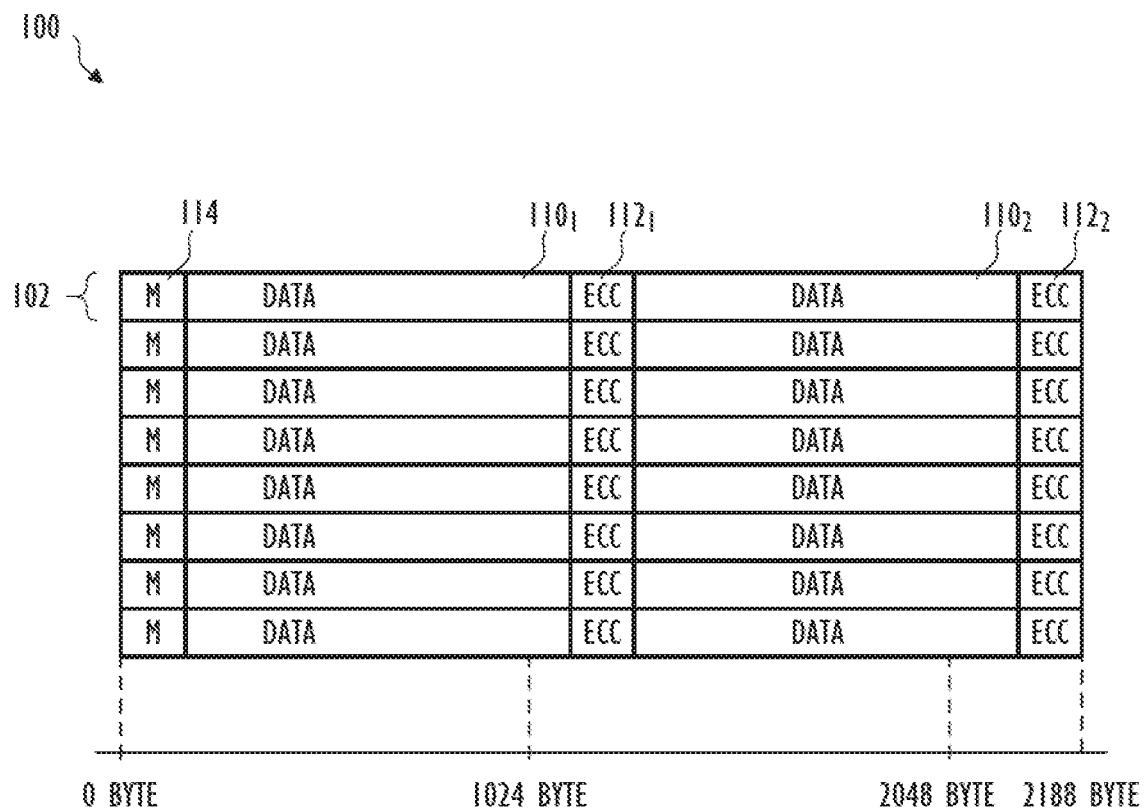
FIG. 1 illustrates a typical configuration of a memory array in a memory device.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense.

Figure 2:
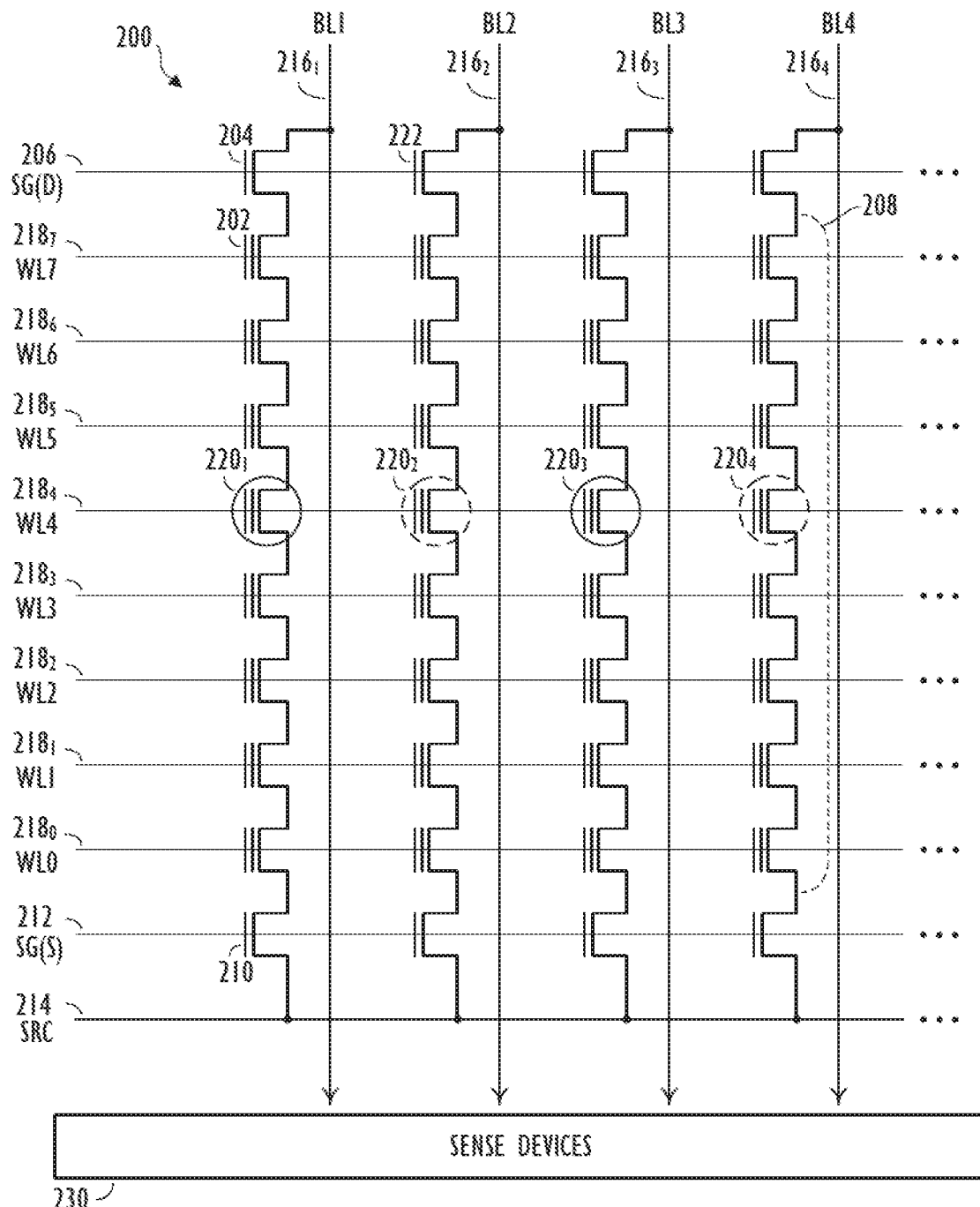
FIG. 2 shows a schematic representation of an array of NAND configured memory cells.

Flash memory typically utilizes one of two basic architectures known as NOR Flash and NAND Flash. The designation is derived from the logic used to read the devices. FIG. 2 illustrates a NAND type flash memory array architecture 200 wherein the memory cells 202 of the memory array are logically arranged in an array of rows and columns. In a conventional NAND Flash architecture, "rows" refer to memory cells having commonly coupled control gates 220, while "columns" refer to memory cells coupled as a particular string of memory cells 208, for example. The memory cells 202 of the array are arranged together in strings (e.g., NAND strings), typically of 8, 16, 32, or more each. Each memory cell of a string are connected together in series, source to drain, between a source line 214 and a data line 216, often referred to as a bit line. The array is accessed by a row decoder (not shown) activating a logical row of memory cells by selecting a particular access line, often referred to as a word line, such as WL7-WL0 $218_{7\text{-}0}$, for example. Each word line 218 is coupled to the control gates of a row of memory cells. Bit lines BL1-BL4 $216_{1\text{-}4}$ can be driven high or low depending on the type of operation being performed on the array. These bit lines BL1-BL4 $216_{1\text{-}4}$ are coupled to sense devices (e.g., sense amplifiers) 230 that detect the state of a target memory cell by sensing voltage or current on a particular bit line 216, for example. As is known to those skilled in the art, the number of word lines and bit lines might be much greater than those shown in FIG. 2.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the charge storage structures (e.g., floating gates or charge traps) of the block of memory cells.

Programming typically involves applying one or more programming pulses to a selected word line (e.g., WL4 $218_4$) and thus to the control gate of each memory cell $220_{1\text{-}4}$ coupled to the selected word line. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the charge storage structures of memory cells targeted for programming. More specifically, the charge storage structures are typically charged through direct injection or Fowler-Nordheim tunneling of electrons from the channel to the storage structure, resulting in a Vt typically greater than zero, for example. In addition, an inhibit voltage is typically applied to bit lines not coupled to a NAND string containing a memory cell that is targeted (e.g., selected) for programming. Typically a verify operation is performed following each applied programming pulse to determine if the selected memory cells have achieved their target (e.g., intended) programmed state. A verify operation generally includes performing a sense operation to determine if a threshold voltage of a memory cell has reached a particular target value.

Memory cells (e.g., flash memory cells) can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell, depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two ranges, two bits by four ranges, three bits by eight ranges, etc. MLC memory cells may store even or odd numbers of bits on each memory cell, and schemes providing for fractional bits (e.g., 1.5 bits per cell) are also known. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc.

Figure 3:
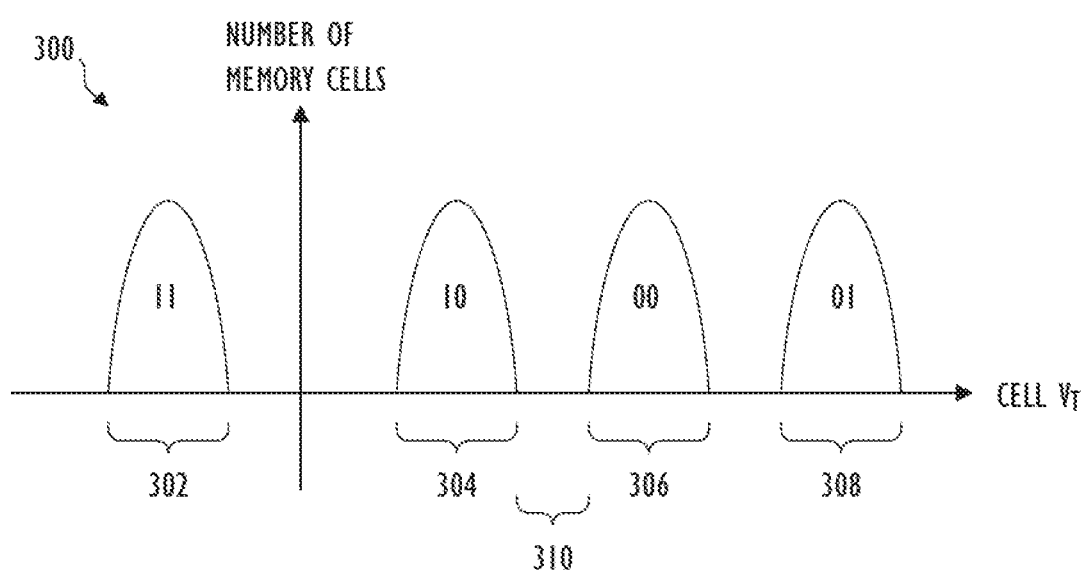
FIG. 3 shows a graphical representation of threshold voltage ranges in a population of memory cells.

FIG. 3 illustrates an example of Vt ranges 300 for a MLC (four level) (e.g., 2-bit) memory cell. For example, a memory cell might be programmed to a Vt that falls within one of four different Vt ranges 302-308 of 200 mV, each being used to represent a data state corresponding to a bit pattern comprised of two bits. Typically, a dead space 310 (e.g., sometimes referred to as a margin and might have a range of 300 mV to 400 mV) is maintained between each range 302-308 to keep the ranges from overlapping. As an example, if the voltage stored on a memory cell is within the first of the four Vt ranges 302, the cell in this case is storing a logical '11' state and is typically considered the erased state of the cell. If the voltage is within the second of the four Vt ranges 304, the cell in this case is storing a logical '10' state. A voltage in the third Vt range 306 of the four Vt ranges would indicate that the cell in this case is storing a logical '00' state. Finally, a Vt residing in the fourth Vt range 308 indicates that a logical '01' state is stored in the cell.

Typically there is a greater likelihood of errors occurring in data stored in higher level memory cells than in lower level memory cells. For example, MLC (four level) typically has a higher likelihood of errors than SLC memory, for example. This can be caused by the increased number and narrowing of the Vt ranges programmed in higher level memory cells. As described above, various error correcting schemes are utilized to attempt to restore data that may have been corrupted.

Figure 4A:
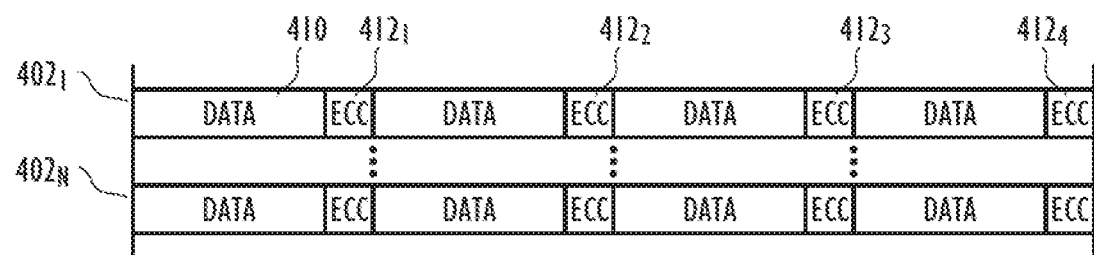
FIGS. 4A-4D show a number of typical configurations of memory cells in a memory device.
Figure 4B:
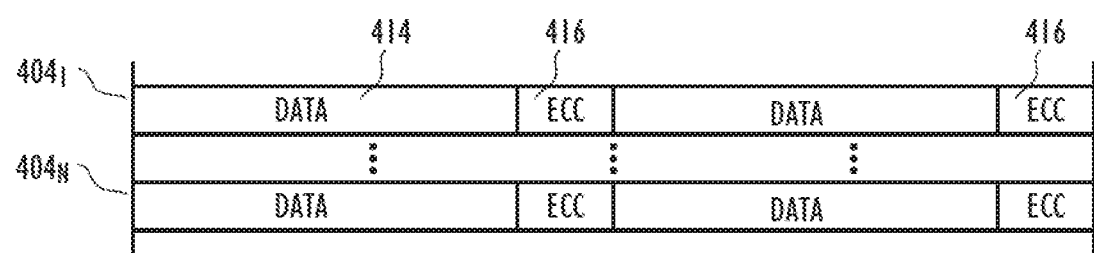
Figure 4C:
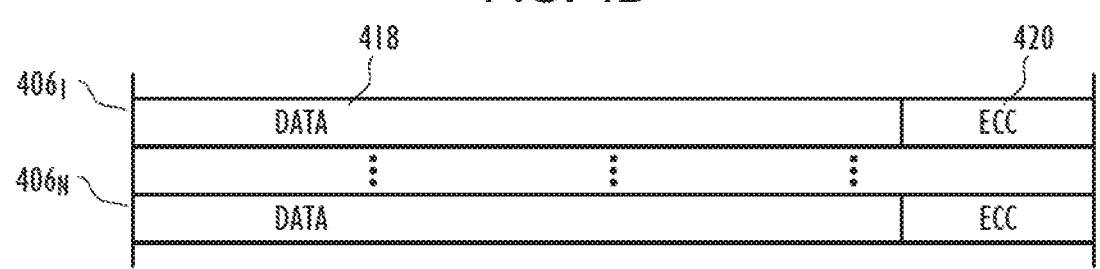
Figure 4D:
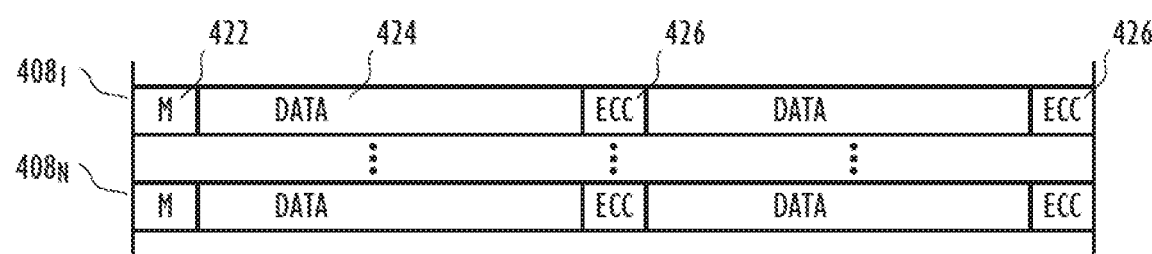

FIGS. 4A-4D illustrates a number of typical configurations of blocks of memory cells as configured in typical memory arrays such as discussed above with respect to FIG. 1. Each block of memory cells of FIGS. 4A-4D comprises a user data space and overhead (e.g., ECC and/or meta-data) data space of memory. These configurations, illustrated by two blocks in each of FIGS. 4A-4D, may be repeated throughout the memory array having N blocks. For example, blocks $402_{1-N}$ of FIG. 4A are configured with the same configuration (e.g., distribution) of user data storage areas 410 and ECC data storage areas 412. Blocks $404_{1-N}$ of FIG. 4B are configured with the same configuration of user data storage areas 414 and ECC data storage areas 416. Blocks $406_{1-N}$ of FIG. 4C are configured with the same configuration of user data storage areas 418 and ECC data storage areas 420. Blocks $408_{1-N}$ of FIG. 4D are configured with the same configuration of user data storage areas 424, ECC data storage areas 426 and block data storage areas (e.g., meta-data) 422, such as described above with respect to FIG. 1, for example.

In contrast with the typical method of allocating user data and overhead data storage areas such as shown in FIGS. 4A-4D, one or more methods according to various embodiments of the present disclosure facilitate an alternate utilization of the overall memory array in a memory device.

Figure 5:
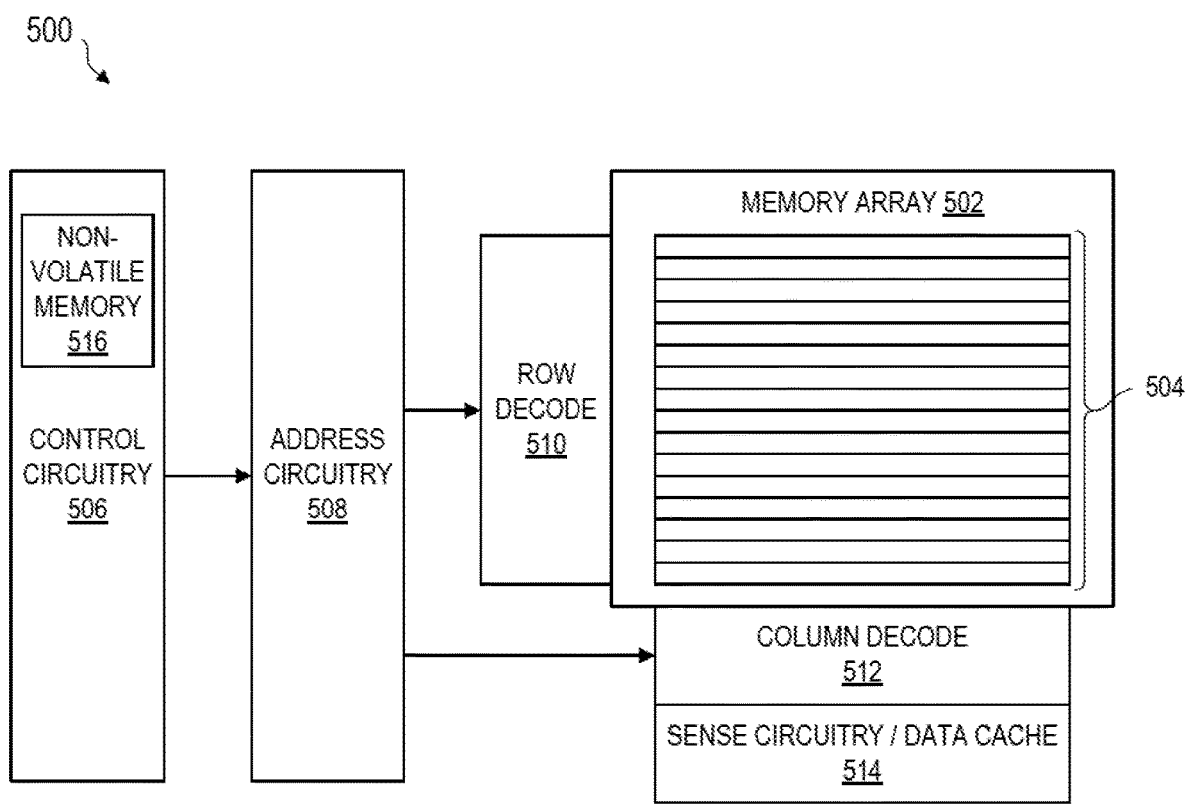
FIG. 5 shows a simplified block diagram of a memory device according to an embodiment of the present disclosure.

FIG. 5 illustrates a portion of a memory device 500 according to various embodiments of the present disclosure. The memory device 500 shown in FIG. 5 has been simplified to focus on particular elements to improve understanding of various embodiments according to the present disclosure. Memory device 500 comprises a memory array 502, such as an array of flash memory cells, for example. The memory array 502 shown in FIG. 5 might be configured in a plurality of individually erasable blocks of memory cells 504 where each block might comprise one or more pages of memory cells. The memory cells of each block of memory array 502 might be logically arranged in rows and in columns such as shown in FIG. 2, for example. The memory cells of memory array 502 might comprise single level (SLC) and/or multi level (MLC) memory cells.

Memory device 500 further comprises row decode circuitry 510 and column decode circuitry 512 which facilitate access to the memory cells of the memory array 502. Address circuitry 508 provides addressing information to the row decode circuitry 510 and to the column decode circuitry 512. Sense circuitry and data cache 514 help facilitate memory device operations such as reading, writing (e.g., programming) and erase operations. For example, the sense circuitry might detect the programmed state of a particular number of selected memory cells to be read. Data cache 514 might store data sensed by the sense circuitry (e.g., such as sense data obtained during a read or verify operation.) Data cache 514 might also store data to be programmed into a particular number of selected memory cells, such as during a programming operation, for example.

Memory device 500 further comprises a controller (e.g., control circuitry) 506 which at least in part facilitates memory device operations according to various embodiments of the present disclosure. The control circuitry 506 might also be coupled to other circuitry of the memory device 500 (not shown), such as to the row decode circuitry 510, column decode circuitry 512 and sense circuitry/data cache 514 circuitry, for example.

In contrast with the fixed configuration of the memory array 100 as shown in FIG. 1, the memory array 502 of FIG. 5 does not comprise fixed locations of particular usage types of memory in the memory array. For example, the memory array 502 of FIG. 5 comprises blocks of memory 504 wherein a memory cell of a block might be configurable for storing either user data or overhead data (e.g., metadata and/or ECC data.) This can facilitate a more efficient use of the memory array 502 over the methods of the prior art. Configuration of the memory array 502 might be based on multiple factors. For example, the user data storage areas and associated (e.g., corresponding) ECC data storage areas might be allocated based on a particular desired level of reliability of user data read from the memory array. Another factor might include configuration of the memory array 502 based on a type of user data to be stored in a particular block of memory cells. Another example includes a configuration based on the type of programming to be performed on memory cells of the array, such as whether cells will be programmed as SLC and/or MLC memory cells, for example. Still further examples include the ability to configure the user data storage area based on a particular requirement of the user data (e.g., word size, etc.) For example, one application (e.g., operating mode) might be most efficient utilizing a particular word size of user data to be stored in memory. However, a different application might be more efficient when utilizing user data having a different word size, for example. For example, a different number memory cells may be allocated for storing user data in response to changing an operating mode of a memory device.

Configurations of user data storage areas and overhead data storage areas might also be different in different areas (e.g., different blocks or pages) of the memory array 502. For example, a first configuration of memory storage areas might be utilized in a first block of memory cells and different configurations might be utilized in different blocks of the memory array 502 according to various embodiments of the present disclosure. Memory storage area allocation of a particular type (e.g., user data, ECC data) might occur across one or more blocks and/or pages of memory cells. The memory storage allocation might span multiple die (i.e., multiple physical die) of the memory device according to various embodiments of the present disclosure. Spare areas might also be allocated exclusively in one or more blocks, such as at the end of the memory array 502, for example.

Control circuitry 506 might be configured to manage the configuration of the memory array 502 according to various embodiments of the present disclosure. Control circuitry 506 might be coupled to a host (e.g., processor) through an interface (not shown) as part of a memory system, for example. According to one or more embodiments, the control circuitry 506 might be configured to configure the space allocation of each block or page of memory cells independently from other blocks/pages of memory cells of the memory array 502. The control circuitry might comprise a memory device (e.g., non-volatile memory 516) in which memory array configuration data is stored. The configuration data might also be stored in a particular portion of the memory array 502, for example. During an initialization operation of the memory device (e.g., such as following a RESET operation), the stored configuration data might be read from the memory storing the configuration data and be loaded into the controller 506.

Figure 6:
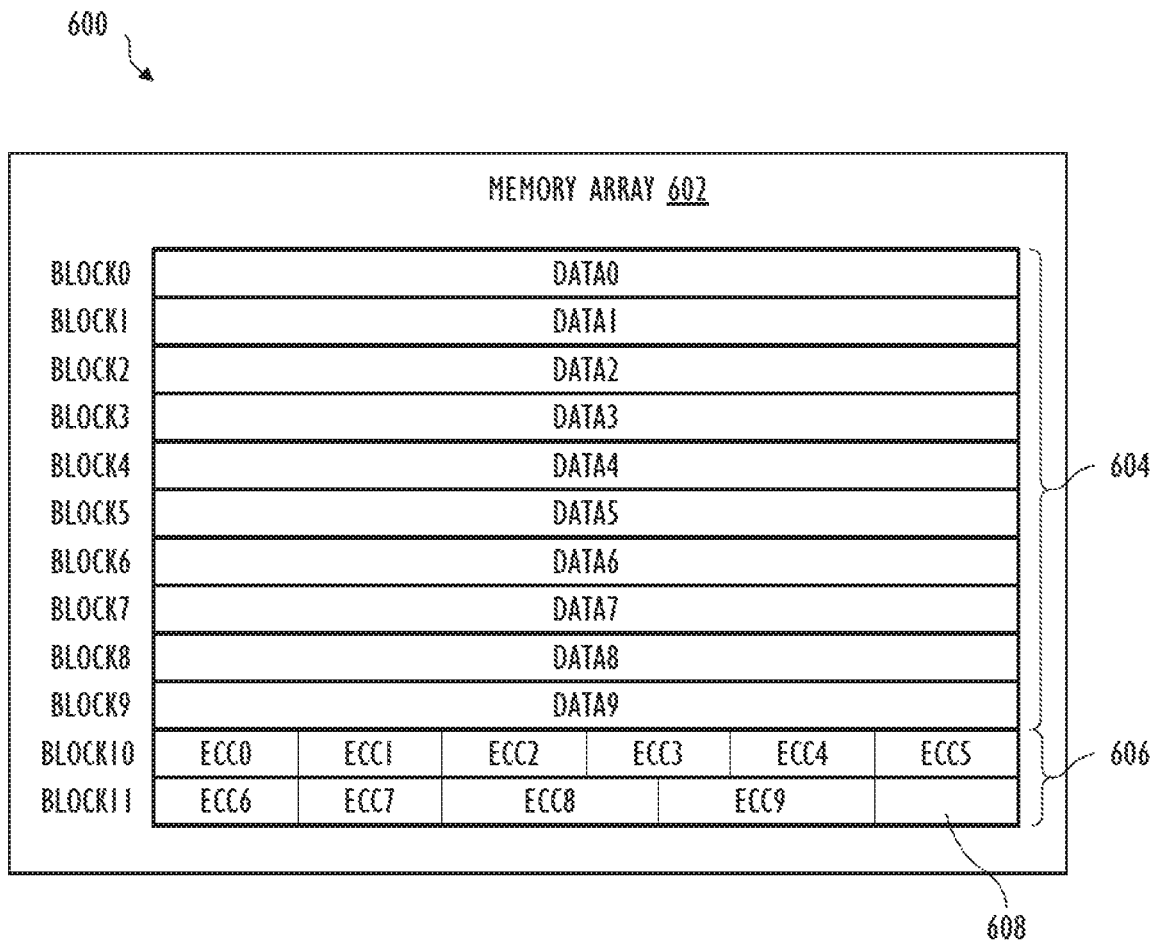
FIG. 6 shows a configuration of memory cells according to an embodiment of the present disclosure.

FIG. 6 illustrates a configuration 600 of a memory array 602, such as memory array 502 of FIG. 5, according to one or more embodiments of the present disclosure. Responsive to a number of possible factors, the memory array of FIG. 6 is configured to store user data in a first portion of the array 604 and to store ECC data in a second portion of the array 606. BLOCK0-BLOCK9 of the memory array store user data which is indicated as DATA0-DATA9 in FIG. 6. For example, a particular application might operate most efficiently with user data stored in groups (e.g., DATA0-DATA9) which each occupy an entire block of the memory array as shown in FIG. 6. Each group of data, such as DATA0-DATA9, might also comprise an integer number of equally sized sub-groups of memory, for example. Each die of the memory device might comprise one or more blocks of memory cells, where each block of memory cells might be further arranged into one or more pages of memory cells, and where each page of memory cells might be further arranged into one or more sectors, for example.

BLOCK10-BLOCK11 have been allocated by the control circuitry as ECC data storage space for the particular array configuration of FIG. 6. For example, user data stored in BLOCK0-BLOCK9 might have associated ECC data stored in an ECC storage area in portion 606 of the memory array 602. For example, ECC0 shown in BLOCK10 might store ECC data associated with user data DATA0 stored in BLOCK0. ECC1 might store ECC data associated with user data DATA1 stored in BLOCK1, and so on. Thus, it can be seen from FIG. 6 that a first portion 604 of the memory array 602 has been allocated to exclusively store user data and a second portion 606 of the array has been allocated to exclusively store ECC data associated with the user data stored in the first portion of the array.

According to various embodiments, the size of each ECC data storage area (e.g., storage capacity) might be varied depending on a number of factors. According to one or more embodiments, the ECC data storage areas might be of the same size, such as shown by the storage areas storing ECC data ECC0-ECC7, for example. According to further embodiments, one or more of the ECC data storage areas might be of different sizes. The ECC data storage areas storing ECC data ECC0-ECC7 are shown to be a different size than the ECC data storage areas storing ECC data ECC8-ECC9. For example, a higher level of reliability might be desired for user data DATA8-DATA9 stored in BLOCK8-BLOCK9 of the memory array 602. Thus, a larger ECC data storage area might be allocated to store the ECC data needed to achieve the desired level of reliability of user data DATA8 and DATA9, for example. As the selection of ECC data storage area sizes might vary, spare storage area 608 in the ECC allocated portion 606 of the memory array might exist. However, a different configuration of the memory array according to one or more embodiments of the present disclosure might not result in the spare area 608 shown in FIG. 6, for example.

Figure 7:
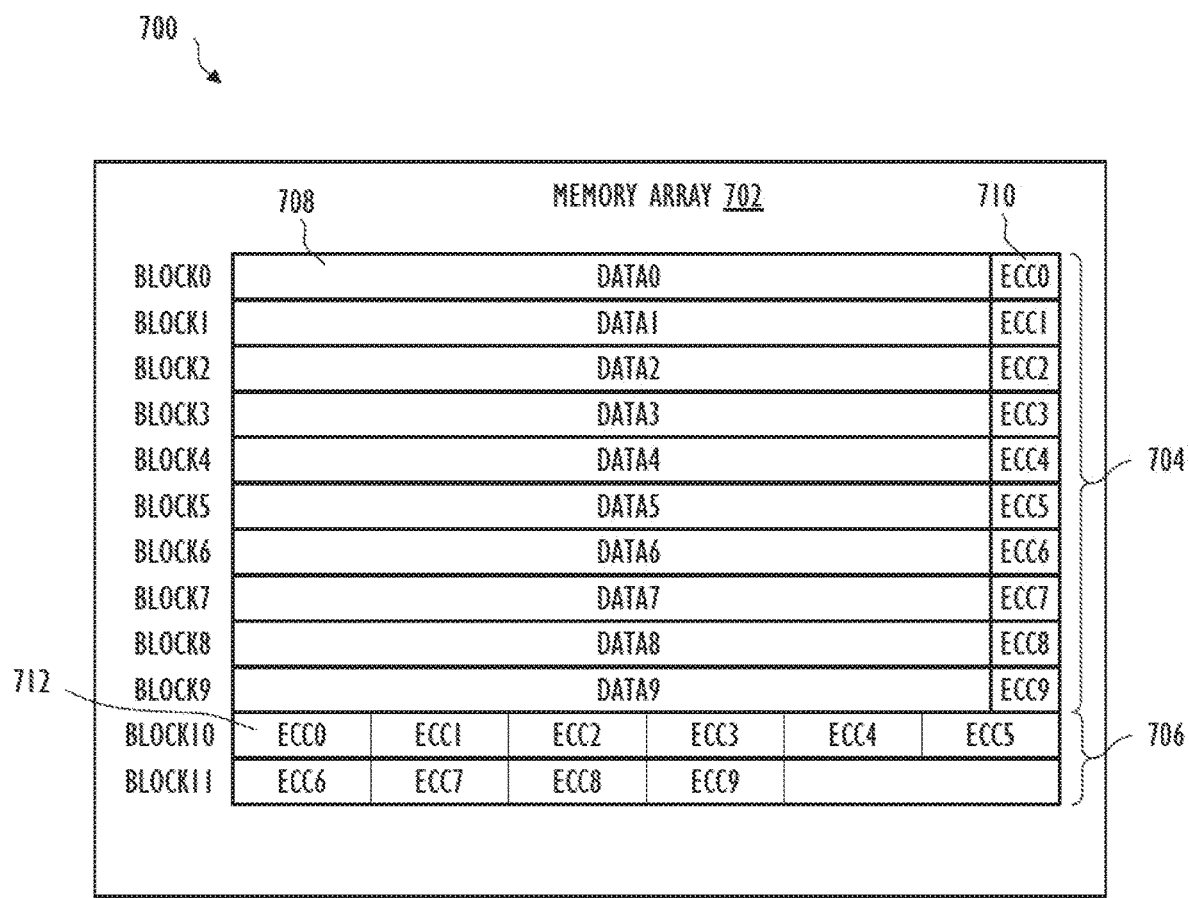
FIG. 7 shows a configuration of memory cells according to an embodiment of the present disclosure.

FIG. 7 illustrates an additional configuration 700 of a memory array 702 according to one or more embodiments of the present disclosure. The memory array 702 of FIG. 7 comprises a portion 706 of the memory array configured to store overhead (e.g., ECC and/or meta-data) data. The memory array is further configured into a portion 704 which stores both user data DATA0-DATA9 and at least some ECC data ECC0-ECC9.

According to the configuration shown in FIG. 7, a first portion of ECC data for each block of user data is stored in its respective block and a second portion of ECC data is stored in the ECC storage portion 706 of the memory array. This can be further illustrated by way of example. The size requirement for user data space in a particular application might be selected such that one or more groups (e.g., one or more pages) of user data DATA0-DATA9 might be stored in a single block of the memory array of FIG. 7. A particular storage size requirement for ECC data might also be determined. However, after the selection of the size of user data space allocated in each block, there might not be enough memory space remaining in the block to also store the desired amount of ECC data. Thus, according to one or more embodiments of the present disclosure, the remaining ECC data for each block which does not fit in its respective block is stored in the ECC storage portion of the memory array 706. For example, a first portion of ECC data ECC0 710 might be stored in BLOCK0 along with its corresponding user data DATA0. The remaining portion of ECC data ECC0 712 might then be stored in the ECC storage portion 706 of the memory array. Similarly, a first portion of ECC1 data is stored in BLOCK1 and a remaining portion of ECC1 data is stored in BLOCK10 of the memory array, and so on. Thus, one or more embodiments of the present disclosure provide for allocating a particular size of user data to be stored in a particular block and determining an ECC space requirement for the user data. Then, ECC data that does not fit within its associated block might be stored in another portion of the memory array designated for storing ECC data 706, for example. This provides flexibility in selecting a most efficient configuration of user data memory cells in a particular block. This also provides flexibility in selecting a desired ECC data space requirement as well.

According to various embodiments, the memory array shown in FIG. 7 might be the same physical memory array (e.g., of the same memory device) as that shown in FIG. 6. For example, when the memory array is utilized in a first application, the configuration of FIG. 6 might be utilized. Subsequently, the memory array might be reconfigured to the configuration shown in FIG. 7 if it is desired to use the same memory array in a second application having different user data space and/or ECC data space requirements than the first application, for example.

Figure 8:
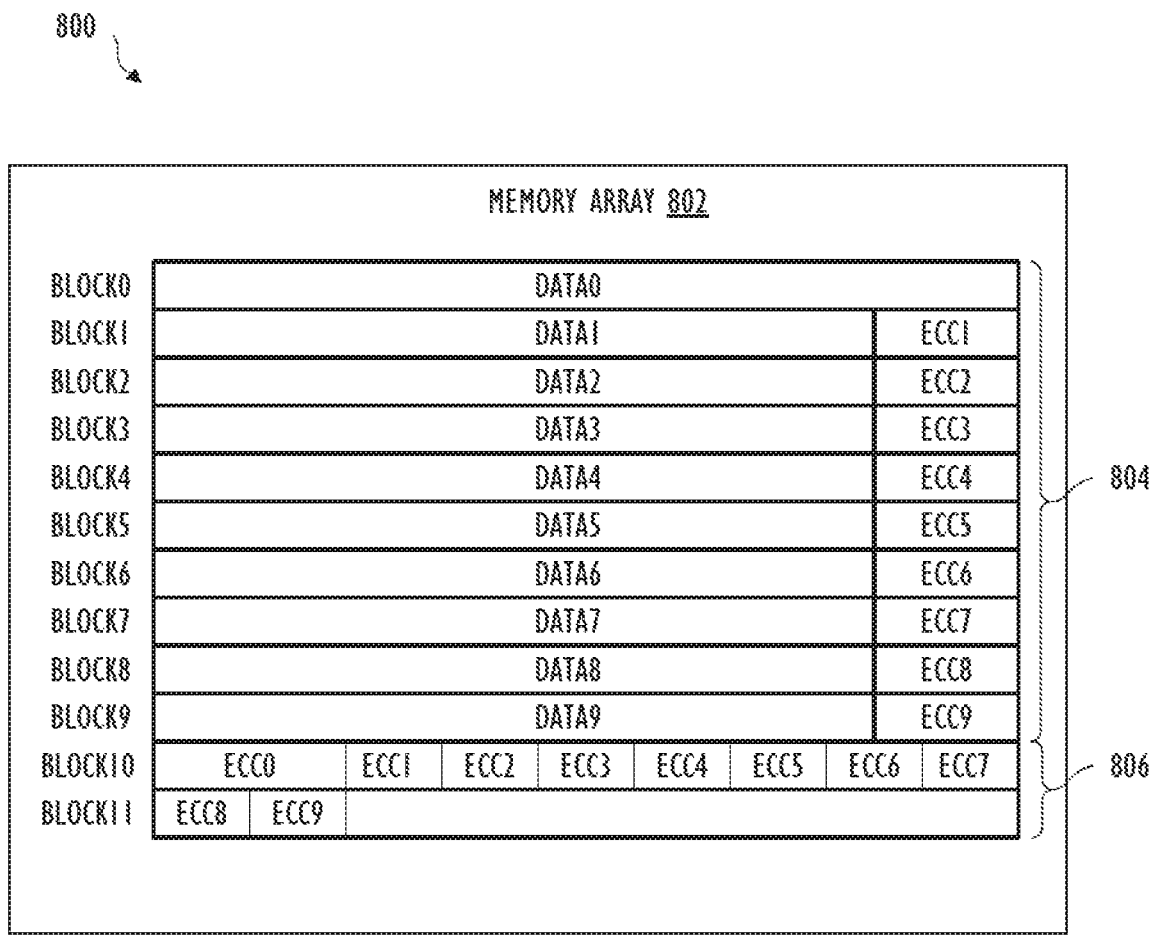
FIG. 8 shows a configuration of memory cells according to an embodiment of the present disclosure.

FIG. 8 illustrates an additional configuration 800 of a memory array 802 according to one or more embodiments of the present disclosure. The memory array 802 of FIG. 8 might be the same physical memory array as the memory array 602 and 702 shown in FIGS. 6 and 7, respectively, for example. The memory array configuration shown in FIG. 8 illustrates a similar configuration as that shown in FIG. 7. However, the configuration of FIG. 8 shows a smaller user data storage area and a larger ECC data storage area per block than that shown in FIG. 7. For example, a memory device comprising memory array 802 might be used in a different application wherein the user data space requirement is less than the example discussed with respect to FIG. 7. Thus, more space is available in each block to store the associated ECC data for each block. Similar to FIG. 7, ECC data which does not fit within its respective block comprising user data, can be stored in the ECC portion of the memory array 806. For example, the remaining portions of ECC data (e.g., ECC0-ECC9 shown in BLOCK10 and BLOCK11) that do not fit in portion 804 of the memory array 802 might be stored consecutively in the ECC portion 806 as shown in FIG. 8. FIG. 8 further illustrates that all of the ECC0 data of DATA0 is stored in the ECC data portion 806 while the remaining user data portion 804 comprises both user data and at least a part of the ECC data for each respective block (e.g., BLOCK1-BLOCKS.)

Figure 9:
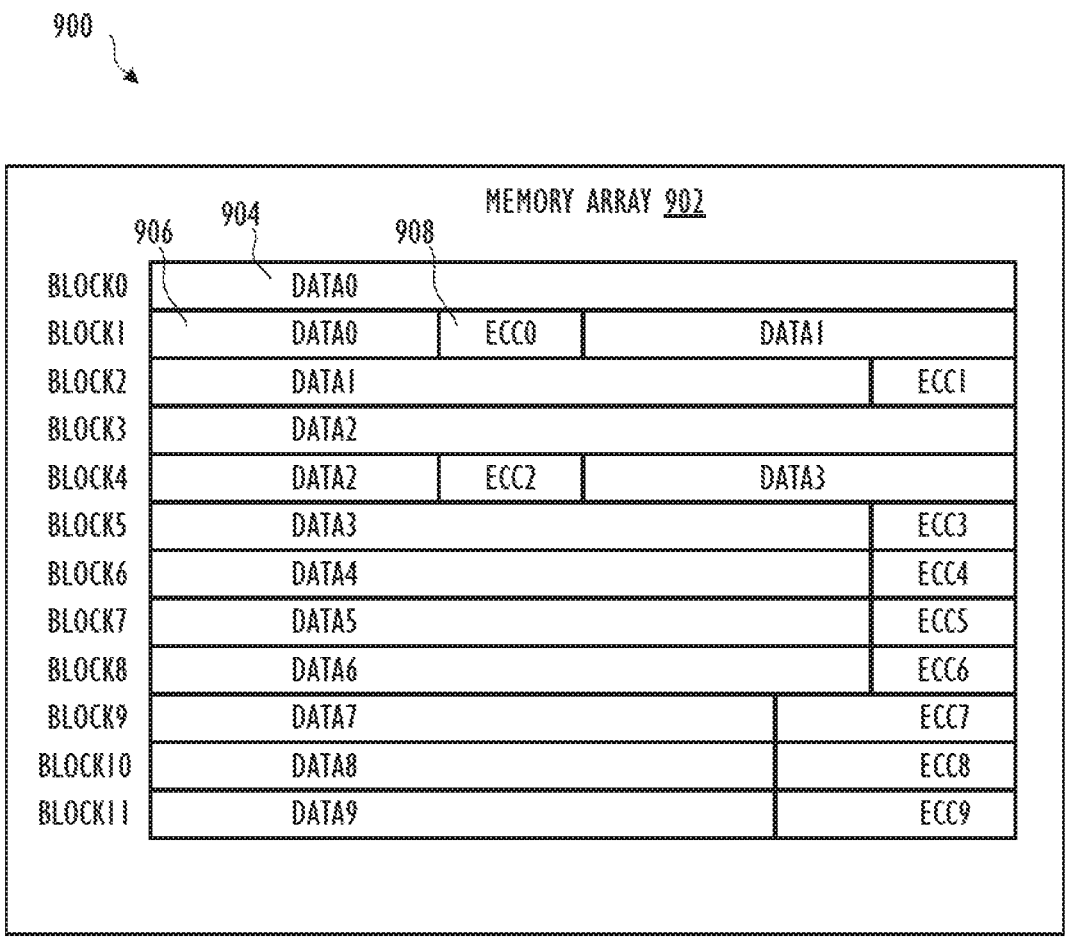
FIG. 9 shows a configuration of memory cells according to an embodiment of the present disclosure.

FIG. 9 illustrates another memory array configuration according to various embodiments of the present disclosure. For a particular application, it might be beneficial to store the user data in groups of a particular size. However, this preferred size might exceed a single block capacity of the memory array. Thus, a configuration such as shown in FIG. 9 might be used. A first portion of the user data DATA0 904 is stored in BLOCK0 of the memory array 902. The remaining portion of the user data DATA0 906 is stored in BLOCK1 of the memory array 902. ECC0 data 908 associated with DATA0 is stored following the portion of user data DATA0 906. User data DATA1 might then be stored following the ECC0 data 908. Thus, a first portion of user data DATA1 is stored in BLOCK1 while a remaining portion of the user data DATA1 is stored in BLOCK2, and so on as shown in FIG. 9.

FIG. 9 further illustrates that the ECC data space per block of the memory array might vary in order to obtain a desired reliability of the associated user data. For example, it might be desirable to utilize a particular ECC data size for user data DATA3-DATA6. However, a higher reliability might be desired for user data DATA7-DATA9, for example. Thus, it can be seen in the Figure that the ECC data storage space in BLOCK9-BLOCK11 is greater than the ECC data storage space of BLOCKS-BLOCKS, for example. According to one or more embodiments, the memory might be further configured to utilize a combination of SLC and MLC configured memory. ECC data might be stored in memory configured as SLC memory, whereas the user data might be stored in memory configured as MLC memory, for example.

It should be noted that FIGS. 6-9 illustrating different memory array configurations according to various embodiments of the present disclosure might all represent different memory configurations of the same physical memory array in a memory device, such as memory array 502 shown in FIG. 5. For example, the memory array 502 might first be configured for a particular application. At a later time, the same memory array might be reconfigured to be used in a different application, for example. Control circuitry 506 of FIG. 5 might receive instructions on a particular application or particular configuration which is used to configure the memory array in one or more of the configurations shown in FIGS. 6-9, for example. It should also be noted that the FIGS. 6-9 illustrate ECC data portions 606/706/806 of the memory arrays each comprising two blocks of the memory array. However, various embodiments according to the present disclosure are not so limited. For example, a first application might configure a memory array to have an ECC data portion comprising two blocks. An additional embodiment might configure the memory array to comprise one block of ECC data and utilize the remainder for user data or user data and ECC data storage, for example. Further embodiments might configure the memory array to comprise more than two blocks storing ECC data, such as applications requiring large amounts of ECC data space to achieve a particular desired level of reliability, for example. These configurations might also be allocated to span multiple die within the memory device, for example.

Although the memory configuration and allocation with respect to FIGS. 6-9 are described in terms of blocks of memory, the various embodiments of the present disclosure might include other logical groupings of memory cells. For example, the configuration and allocation methods described above with regards to FIGS. 6-9 might also be described in terms of pages of memory cells. For example, the memory arrays 602/702/802/902 might be representative of a plurality of pages of memory cells of a particular block of memory cells in the Figures. Each row of memory arrays 602/702/802/902 might be representative of a page of memory cells within a block of memory cells, for example.

Figure 10:
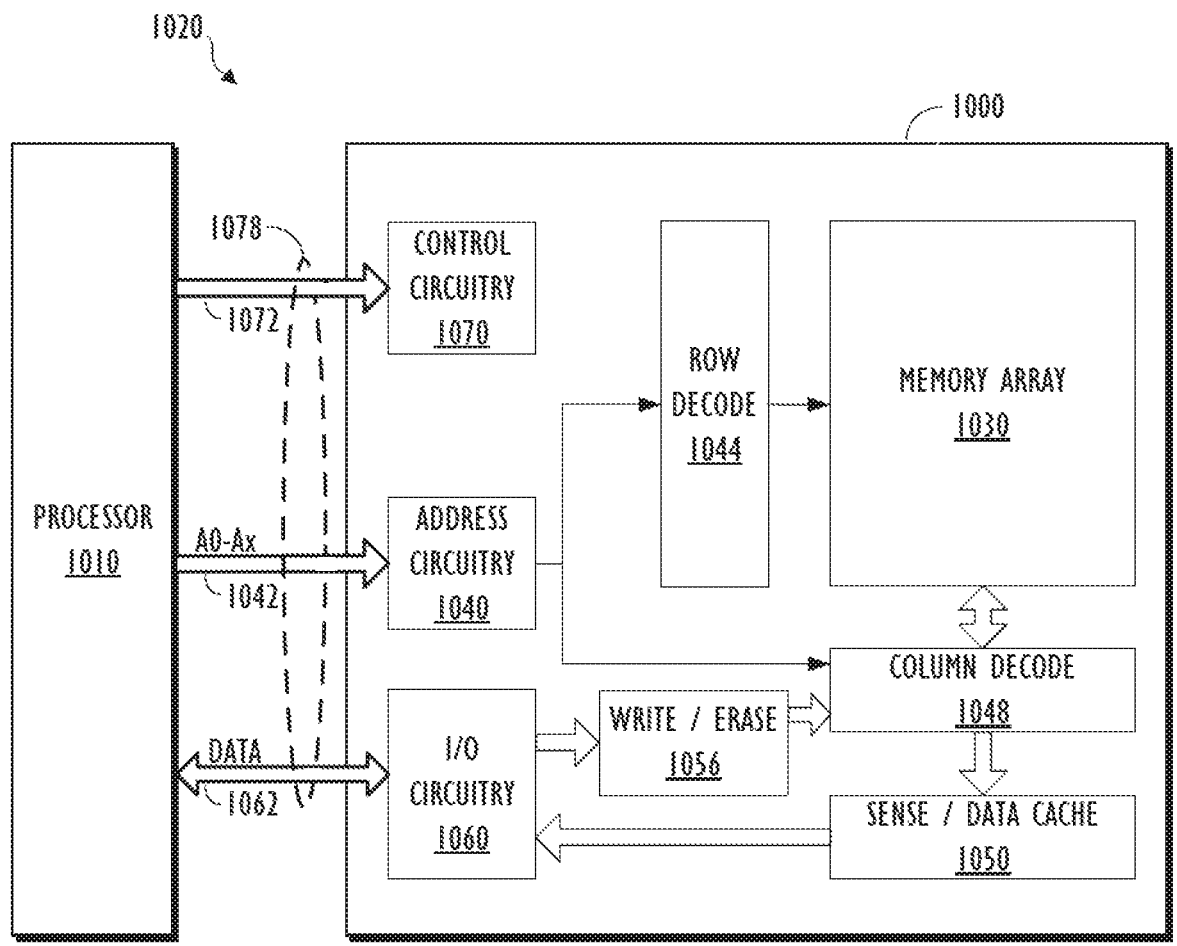
FIG. 10 is a simplified block diagram of a memory device coupled to a host as part of an electronic system according to an embodiment of the present disclosure.

FIG. 10 is a functional block diagram of an electronic system having at least one memory device according to one or more embodiments of the present disclosure. The memory device 1000 illustrated in FIG. 10 is coupled to a memory access device, such as a processor 1010. The processor 1010 may be a microprocessor or some other type of controlling circuitry which might be configured to, at least in part, facilitate configuration operations according to various embodiments of the present disclosure, for example. The memory device 1000 and the processor 1010 form part of an electronic system 1020. According to one or more embodiments of the present disclosure, the memory device 1000 might comprise the memory device 500 discussed above with respect to FIG. 5, for example. The memory device 1000 has been simplified to focus on features of the memory device that are helpful in understanding various embodiments of the present disclosure.

The memory device 1000 includes one or more memory arrays 1030 that might be logically arranged in banks of rows and columns. According to one or more embodiments, the memory cells of memory array 1030 are flash memory cells. The memory array 1030 might include multiple banks and blocks of memory cells residing on a single or multiple die as part of the memory device 1000. Memory array 1030 might comprise SLC and/or MLC memory. The memory array 1030 might also be adaptable to store varying densities (e.g., MLC (four level) and MLC (eight level)) of data in each cell, for example.

An address buffer circuit 1040 is provided to latch address signals provided on address input connections A0-Ax 1042. Address signals are received and decoded by a row decoder 1044 and a column decoder 1048 to access the memory array 1030. Row decoder 1044 might comprise driver circuits configured to drive the word lines of the memory array 1030, for example. It will be appreciated by those skilled in the art, with the benefit of the present description, that the number of address input connections 1042 might depend on the density and architecture of the memory array 1030. That is, the number of address digits increase with both increased memory cell counts and increased bank and block counts, for example.

The memory device 1000 reads data in the memory array 1030 by sensing voltage or current changes in the memory array columns using sense devices, such as sense/data cache circuitry 1050. The sense/data cache circuitry 1050, in at least one embodiment, is coupled to read and latch a row of data from the memory array 1030. Data input and output (I/O) buffer circuitry 1060 is included for bi-directional data communication over a plurality of data connections 1062 with the processor 1010. Write/erase circuitry 1056 is provided to write data to or to erase data from the memory array 1030.

Control circuitry 1070 is configured at least in part to implement various embodiments of the present disclosure, such as facilitating the memory configuration operations discussed above, for example. In at least one embodiment, the control circuitry 1070 may utilize a state machine. Control circuitry 1070 might be similar in configuration and functionality as control circuitry 506 discussed above with respect to FIG. 5, for example.

Control signals and commands can be sent by the processor 1010 to the memory device 1000 over the command bus 1072. The command bus 1072 may be a discrete signal or may be comprised of multiple signals, for example. These command signals 1072 are used to control the operations on the memory array 1030, including data read, data write (e.g., program), and erase operations. The command bus 1072, address bus 1042 and data bus 1062 may all be combined or may be combined in part to form a number of standard interfaces 1078. For example, the interface 1078 between the memory device 1000 and the processor 1010 might be a Universal Serial Bus (USB) interface. The interface 1078 might also be a standard interface used with many hard disk drives (e.g., SATA, PATA) as are known to those skilled in the art.

The electronic system illustrated in FIG. 10 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide methods of configuring user data and overhead data memory cells in a non-volatile memory device. These methods might facilitate a more efficient allocation of memory cells allocated during the configuration of a memory device for a particular application. These methods might facilitate a significant reduction in allocating more spare memory cells than might be needed given a particular application that the memory device is to be used in. More efficient memory device operation resulting from utilizing one or more of these methods of tailoring the allocation of memory cells in response to a particular memory device application might also be recognized.

Although specific embodiments have been illustrated and described herein, it will be appreciated by those of ordinary skill in the art that other configurations may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:
    a plurality of blocks of memory cells, each of the plurality of blocks of memory cells being individually erasable; and
    a controller configured to configure a first block of memory cells of the plurality of blocks of memory cells in a first configuration comprising one or more groups of overhead data memory cells, to configure a second block of memory cells of the plurality of blocks of memory cells in a second configuration comprising a group of user data memory cells and a group of overhead data memory cells, and to configure a third block of memory cells of the plurality of blocks of memory cells in a third configuration comprising only a group of user data memory cells;
    wherein the first configuration is different than the second configuration and the third configuration is different than the first and second configurations;
    wherein the group of overhead data memory cells of the second block of memory cells comprises a different storage capacity than at least one group of overhead data memory cells of the one or more groups of overhead data memory cells of the first block of memory cells; and
    wherein the controller is further configured in response to each read operation on the second block of memory cells, to read user data from the group of user data memory cells of the second block of memory cells, to read a first portion of error correction code (ECC) data specific to the read user data from the group of overhead data memory cells of the second block of memory cells, and to read a second portion of the ECC data from a group of overhead data memory cells of the one or more groups of overhead data of the first block of memory cells corresponding to the read user data.

2. The memory device of claim 1, wherein a group of overhead data memory cells of the one or more groups of overhead data memory cells of the first block of memory cells is configured to store ECC data specific to user data stored in the group of user data memory cells of the third block of memory cells.

3. The memory device of claim 2, wherein the group of overhead data memory cells of the one or more groups of overhead data memory cells of the first block of memory cells that is configured to store the ECC data specific to the user data stored in the group of user data memory cells of the third block of memory cells has a larger storage capacity than remaining groups of overhead data memory cells of the one or more groups of overhead data memory cells of the first block of memory cells.

4. The memory device of claim 1, wherein the group of overhead data memory cells of the second block of memory cells stores a portion of ECC data that is specific to user data stored in the group of user data memory cells of the second block of memory cells, and at least one of the one or more groups of overhead data memory cells of the first block of memory cells stores another portion of the ECC data that is specific to user data stored in the group of user data memory cells of the second block of memory cells.

5. The memory device of claim 1, wherein the controller is configured to configure the one or more groups of overhead data memory cells of the first block of memory cells as one or more groups of single level memory cells and the group of overhead data memory cells of the second block of memory cells as a group of single level memory cells, wherein the controller is configured to configure the group of user data memory cells of the second block of memory cells as a group of multilevel memory cells, and wherein the controller is configured to configure the group of user data memory cells of the third block of memory cells as a group of multilevel memory cells.

6. The memory device of claim 1, wherein the group of user data memory cells of the third block of memory cells comprises a larger storage capacity than the group of user data memory cells of the second block of memory cells.

7. The memory device of claim 1, wherein the controller is configured to configure space allocation of the first, second, and third blocks of memory cells independently of each other.

8. The memory device of claim 1, wherein the controller comprises a non-volatile memory in which memory array configuration data is stored.

9. A memory device, comprising:
a plurality of blocks of memory cells, each of the plurality of blocks of memory cells being individually erasable; and
a controller configured to configure a first block of memory cells of the plurality of blocks of memory cells in a first configuration comprising one or more groups of overhead data memory cells configured as single level memory cells, to configure a second block of memory cells of the plurality of blocks of memory cells in a second configuration comprising a group of user data memory cells configured as multilevel memory cells and a group of overhead data memory cells configured as single level memory cells, and to configure a third block of memory cells of the plurality of blocks of memory cells in a third configuration comprising only a group of user data memory cells configured as multilevel memory cells;
wherein the first configuration is different than the second configuration and the third configuration is different than the first and second configurations;
wherein the group of overhead data memory cells of the second block of memory cells comprises a different storage capacity than at least one group of overhead data memory cells of the one or more groups of overhead data memory cells of the first block of memory cells; and
wherein the controller is further configured, in response to each read operation on the second block of memory cells, to read user data from the group of user data memory cells of the second block of memory cells, to read a first portion of error correction code (ECC) data specific to the read user data from the group of overhead data memory cells of the second block of memory cells and to read a second portion of the ECC data from a group of overhead data memory cells of the one or more groups of overhead data of the first block of memory cells corresponding to the read user data.

10. The memory device of claim 9, wherein the group of overhead data memory cells of the second block of memory cells stores a portion of ECC data that is specific to user data stored in the group of user data memory cells of the second block of memory cells, and a particular group of overhead data memory cells of the one or more groups of overhead data memory cells of the first block of memory cells stores another portion of the ECC data that is specific to user data stored in the group of user data memory cells of the second block of memory cells.

11. The memory device of claim 10, wherein the particular group of overhead data memory cells of the first block of memory cells comprises a different storage capacity than at least one other group of overhead data memory cells of the one or more groups of overhead data memory cells of the first block of memory cells.

12. The memory device of claim 10, wherein a different group of overhead data memory cells of the one or more groups of overhead data memory cells of the first block of memory cells is configured to store the ECC data specific to the user data stored in the group of user data memory cells of the third block of memory cells.

13. The memory device of claim 10, wherein the different group of overhead data memory cells has a larger storage capacity than the particular group of overhead data memory cells.

14. The memory device of claim 13, wherein the different group of overhead data memory cells has a larger storage capacity than each remaining group of overhead data memory cells of the one or more groups of overhead data memory cells of the first block of memory cells.

15. The memory device of claim 9, wherein the group of user data memory cells of the third block of memory cells comprises a larger storage capacity than the group of user data memory cells of the second block of memory cells.

16. The memory device of claim 9, wherein the controller is configured to configure space allocation of the first, second, and third blocks of memory cells independently of each other.

17. The memory device of claim 9, wherein the controller comprises a non-volatile memory in which memory array configuration data is stored.

18. A memory device, comprising:
a plurality of blocks of memory cells, each of the plurality of blocks of memory cells being individually erasable; and
a controller configured to configure a first block of memory cells of the plurality of blocks of memory cells in a first configuration comprising one or more groups of overhead data memory cells, to configure a second block of memory cells of the plurality of blocks of memory cells in a second configuration comprising a group of user data memory cells and a group of overhead data memory cells, and to configure a third block of memory cells of the plurality of blocks of memory cells in a third configuration comprising only a group of user data memory cells;
wherein the first configuration is different than the second configuration and the third configuration is different than the first and second configurations;
wherein the group of overhead data memory cells of the second block of memory cells comprises a smaller storage capacity than at least one group of overhead data memory cells of the one or more groups of overhead data memory cells of the first block of memory cells;

wherein the group of overhead data memory cells of the second block of memory cells comprises a larger storage capacity than at least one other group of overhead data memory cells of the one or more groups of overhead data memory cells of the first block of memory cells; and wherein the controller is further configured, in response to each read operation on the second block of memory cells, to read user data from the group of user data memory cells of the second block of memory cells, to read a first portion of error correction code (ECC) data specific to the read user data from the group of overhead data memory cells of the second block of memory cells, and to read a second portion of the ECC data from a group of overhead data memory cells of the one or more groups of overhead data of the first block of memory cells corresponding to the read user data.

19. The memory device of claim 18, wherein a particular group of overhead data memory cells of the one or more groups of overhead data memory cells of the first block of memory cells is configured to store ECC data specific to user data stored in the group of user data memory cells of the third block of memory cells.

20. The memory device of claim 18, wherein the particular group of overhead data memory cells of the one or more groups of overhead data memory cells of the first block of memory cells comprises a larger storage capacity than the group of overhead data memory cells of the second block of memory cells and a larger storage capacity than each remaining group of overhead data memory cells of the one or more groups of overhead data memory cells of the first block of memory cells.

* * * * *